(12) United States Patent  
Pokhil et al.

(10) Patent No.: US 6,735,062 B1
(45) Date of Patent: May 11, 2004

(54) TRIANGULAR MAGNETIC FIELD SENSOR (75) Inventors: Taras G. Pokhil, Arden Hills, MN (US); Olle Heinonen, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 302 days.

(21) Appl. No.: 09/850,818

(22) Filed: May 8, 2001

Related U.S. Application Data (60) Provisional application No. 60/240,362, filed on Oct. 13, 2000.

(51) Int. Cl.[7] ................................................. G11B 5/39
(52) U.S. Cl. ................................................. 360/324.12
(58) Field of Search ..................................... 360/324.12

(56) References Cited

U.S. PATENT DOCUMENTS

| | | | |
|---|---|---|---|
| 5,742,162 A | * | 4/1998 | Nepela et al. ............. 324/252 |
| 5,748,415 A | * | 5/1998 | Christner et al. |
| 5,978,184 A | * | 11/1999 | Terunuma |
| 6,381,107 B1 | * | 4/2002 | Redon et al. ........... 360/324.12 |
| 6,433,973 B1 | * | 8/2002 | Li et al. ................. 360/324.12 |

OTHER PUBLICATIONS

R.P. Cowburn et al., "Designing nanostructured magnetic materials by symmetry", *Europhysics Letters,* Oct. 15, 1999, pp 221–227.

* cited by examiner

*Primary Examiner*—Craig A. Renner
(74) *Attorney, Agent, or Firm*—Kinney & Lange, P.A.

(57) ABSTRACT

A magnetic field sensor for detecting fields applied from an adjacent medium such as a disc has an air-bearing surface and includes a pinned layer, a free layer, and a spacer layer between the pinned layer and the free layer. The free layer has a first width at the air-bearing surface and a second width smaller than the first width at a position spaced from the air-bearing surface. In one embodiment, the free layer may be generally triangular in shape. The pinned layer and spacer layer may also be generally triangular in shape.

13 Claims, 6 Drawing Sheets

TRIANGULAR MAGNETIC FIELD SENSOR

CROSS-REFERENCE TO RELATED APPLICATION(S)

This application claims priority from Provisional Application No. 60/240,362 filed Oct. 13, 2000 for "Triangular Magnetic Field Sensor" by T. Pokhil and O. Heinonen.

INCORPORATION BY REFERENCE

The aforementioned Provisional Application No. 60/240,362 is hereby incorporated by reference in its entirety.

BACKGROUND OF THE INVENTION

The present invention relates to a magnetic field sensor having a triangular geometry for accurate detection of magnetic fields from an adjacent medium such as a magnetic disc.

In a magnetic data storage and retrieval system, a magnetic recording head typically includes a reader portion having a magnetoresistive (MR) sensor for retrieving magnetically encoded information stored on a magnetic disc. Magnetic flux from the surface of the disc causes rotation of the magnetization vector of a sensing layer of the MR sensor, which in turn causes a change in electrical resistivity of the MR sensor. The change in resistivity of the MR sensor can be detected by passing a current through the MR sensor and measuring a voltage across the MR sensor. External circuitry then converts the voltage information into an appropriate format and manipulates that information as necessary to recover the information encoded on the disc.

MR sensors have been developed that can be characterized in three general categories: (1) anisotropic magnetoresistive (AMR) sensors, (2) giant magnetoresistive (GMR) sensors, including spin valve (SV) sensors and multilayer GMR sensors, and (3) tunneling magnetoresistive (TMR) sensors.

AMR sensors generally have a single MR layer formed of a ferromagnetic material. The resistance of the MR layer varies as a function of $\cos^2\alpha$, where $\alpha$ is the angle formed between the magnetization vector of the MR layer and the direction of the sense current flowing in the MR layer.

GMR sensors have a series of alternating magnetic and nonmagnetic layers. The GMR effect steps from different mean free paths of the two electron spin states in the magnetic layers, and from different transmission and reflection properties of the two spin states at interfaces between the magnetic and nonmagnetic layers. As a consequence, the resistance of a GMR sensor depends on the relative orientations of the magnetization in consecutive magnetic layers, and varies as the cosine of the angle between the magnetization vectors of consecutive magnetic layers.

TMR sensors have a configuration similar to GMR sensors, except that the magnetic layers of the sensor are separated by an insulating film thin enough to allow electron tunneling between the magnetic layers. The tunneling probability of an electron incident on the barrier from one magnetic layer depends on the character of the electron wave function and the spin of the electron relative to the magnetization direction in the other magnetic layer. As a consequence, the resistance of the TMR sensor depends on the relative orientations of the magnetization of the magnetic layers, exhibiting a minimum for a configuration in which the magnetizations of the magnetic layers are parallel and a maximum for a configuration in which the magnetizations of the magnetic layers are anti-parallel.

For all types of MR sensors, magnetization rotation occurs in response to magnetic flux from the disc. As the recording density of magnetic discs continues to increase, the width of the tracks on the disc must decrease, which necessitates smaller and smaller MR sensors as well. As MR sensors become smaller in size, particularly for sensors with dimensions less than about 0.1 micro-meters ($\mu$m), the sensors have the potential to exhibit an undesirable magnetic response to applied fields from the magnetic disc. MR sensors must be designed in such a manner that even small sensors are free from magnetic noise and provide a signal with adequate amplitude for accurate recovery of the data written on the disc. The present invention is directed to an MR sensor having a unique geometric design for achieving such performance.

BRIEF SUMMARY OF THE INVENTION

The present invention is a magnetic field sensor for detecting fields applied from an adjacent medium such as a disc. The magnetic field sensor has an air-bearing surface and includes a pinned layer, a free layer, and a spacer layer between the pinned layer and the free layer. The free layer has a first width at the air-bearing surface and a second width smaller than the first width at a position spaced from the air-bearing surface. In one embodiment, the free layer may be generally triangular in shape. The pinned layer and spacer layer may also be generally triangular in shape.

DETAILED DESCRIPTION

Figure 1:
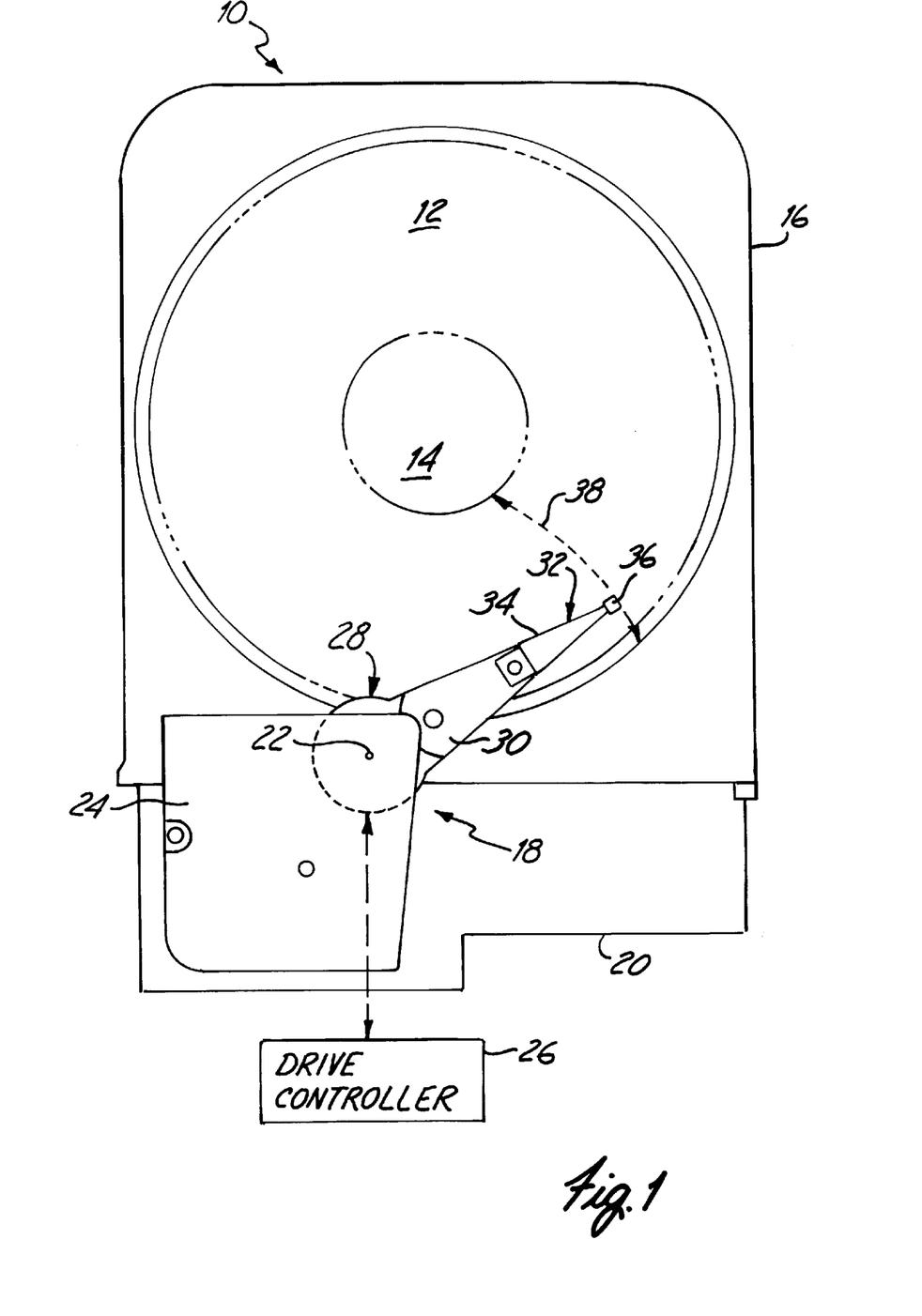
FIG. 1 is a top view of a typical disc drive system employing a magnetoresistive head.

FIG. 1 is a top view of typical disc drive system 10 employing a magnetoresistive (MR) head. Disc drive system 10 includes magnetic disc 12 mounted for rotational movement about an axis defined by spindle 14 within housing 16. Disc drive system 10 also includes actuator 18 mounted to base plate 20 of housing 16, with actuator 18 being pivotally movable relative to disc 14 about axis 22. Cover 24 covers a portion of actuator 18. Drive controller 26 is coupled to actuator 18. Drive controller 26 is either mountable within disc drive system 10 or is located outside of disc drive system 10 with suitable connection to actuator 18. Actuator 18 includes e-block assembly 28, actuator arm 30 and head suspension assembly 32. Head suspension assembly 32 includes load beam 34 coupled to actuator arm 30 and air bearing slider 36 coupled to load beam 34 by a flexure. Slider 36 carries an MR transducing head for reading information from disc 12 and for encoding information on disc 12.

During operation, drive controller 26 receives position information indicating a location on disc 12 to be accessed. Based on the position information, drive controller provides a position signal to actuator 18, which causes actuator 18 to pivot about axis 22. The movement causes slider 36 to move radially over the surface of disc 12 in a path indicated by arrow 38. Drive controller 26 and actuator 18 operate in a known manner so that the transducer carried by slider 36 is positioned over the desired location of disc 12. Once the transducer is properly positioned, a desired read or write operation is performed.

Figure 2:
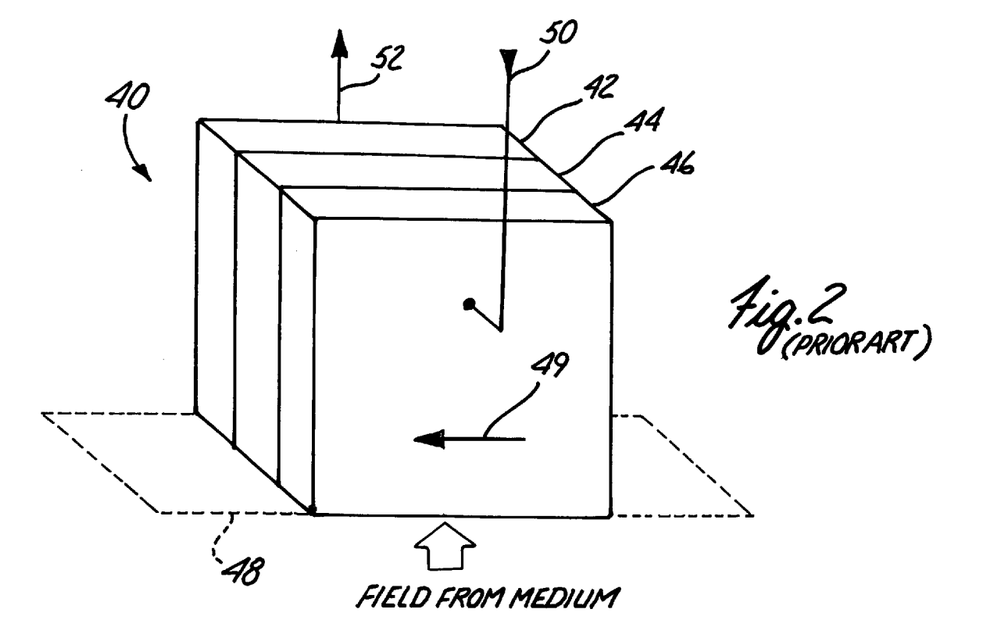
FIG. 2 is a diagram illustrating a typical MR read element forming a portion of the transducing head employed in a disc drive system.

FIG. 2 is a diagram illustrating typical MR read element 40 forming a portion of the transducing head employed in a disc drive system. The specific configuration of MR read element 40 is shown as a spin valve (SV) sensor. It should be understood by those skilled in the art throughout the following discussion of the characteristics of MR read elements according to the prior art and the present invention that the general principles discussed are applicable to all MR sensors, and not just the SV sensor shown for illustration in the drawings herein. MR read element 40 includes pinned layer 42, spacer layer 44 and free layer 46, and has air-bearing surface 48 for confronting the surface of the disc. Pinned layer 42 and free layer 46 are typically ferromagnetic, while spacer layer 44 is typically a nonmagnetic layer. The magnetization of pinned layer 42 is fixed in a predetermined direction, typically normal to air-bearing surface 48, such as by exchange coupling of an antiferromagnetic material or another method known in the art. The magnetization of free layer 46 is weakly biased in the direction of arrow 49, parallel to air-bearing surface 48, using permanent magnets or by exchange biasing from an antiferromagnet. The magnetization of free layer 46 is free to rotate in response to an external magnetic field from the surface of the disc medium. A sense current is applied through MR read element 40 as indicated by terminal conductors 50 and 52, forming a "current perpendicular to plane" (CPP) geometry known in the art. Another configuration known in the art is a "current in plane" (CIP) geometry, where the sense current terminal conductors would be connected to opposite sides of free layer 46 to cause current to flow from one side of free layer 46 to the other, parallel to air-bearing surface 48.

In operation, a magnetic field from the surface of the disc causes the magnetization of free layer 46 to rotate, which changes the resistance of MR read element 40. With a constant bias current through terminal conductors 50 and 52 and passing through MR read element 40, measuring the voltage across MR read element 40 provides an indication of the resistance of MR read element 40, and this information is manipulated and interpreted to determine the content of the data recorded on the disc. More specifically, the resistance of MR read element 40 is related to the angle of the magnetization vector of free layer 46. Thus, it is desirable for nearly collinear magnetization to occur in free layer 46 of MR read element 40 for consistency in the angle of the magnetization vector throughout magnetic domains of the sensor, and for magnetic vortex states to be suppressed. These properties reduce magnetic noise associated with the sensor response. As MR sensors become smaller and smaller, the potential for undesirable sensor response in the square sensor shape increases. In order to ensure the desired sensor response, the present invention is designed with a unique sensor shape, as shown in FIG. 3.

Figure 3:
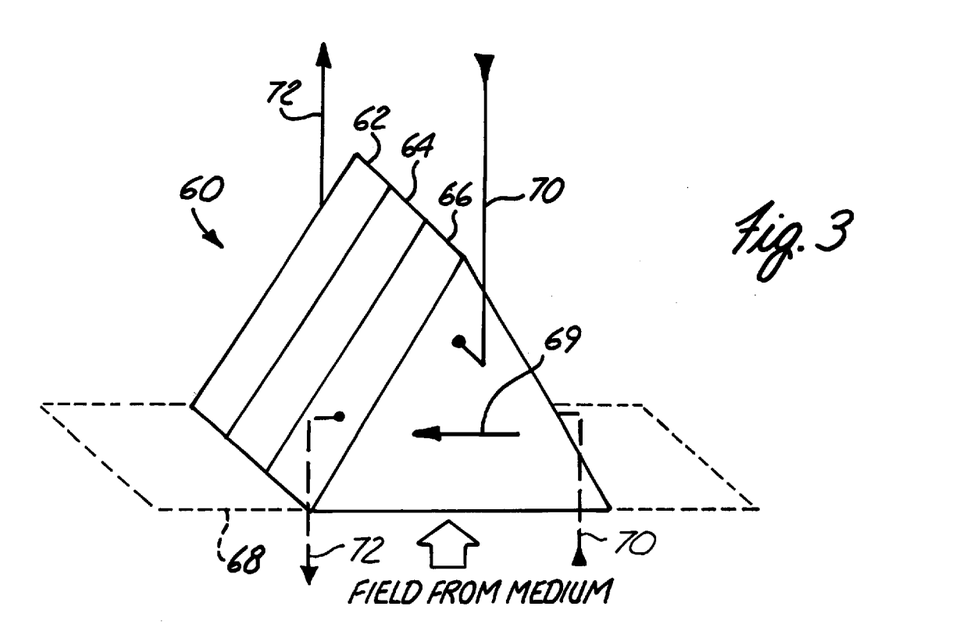
FIG. 3 is a diagram illustrating a triangular MR read element forming a portion of the transducing head employed in a disc drive system according to the present invention.

FIG. 3 is a diagram illustrating triangular MR read element 60 forming a portion of the transducing head employed in a disc drive system according to the present invention. MR read element 60 includes pinned layer 62, spacer layer 64 and free layer 66, and has air-bearing surface 68 for confronting the surface of the disc. Pinned layer 62, spacer layer 64 and free layer 66 are configured similarly and composed of the same materials as pinned layer 42, spacer layer 44 and free layer 46 shown and described in FIG. 2. The magnetization of free layer 66 is weakly biased in the direction of arrow 69, parallel to air-bearing surface 68, using permanent magnets or by exchange biasing from an antiferromagnet. The magnetization of free layer 66 is free to rotate in response to an external magnetic field from the surface of the disc medium. A sense current is applied through triangular MR read element 60 as indicated by terminal conductors 70 and 72, forming a "current perpendicular to plane" (CPP) geometry. Another possible configuration is a "current in plane" (CIP) geometry, where the sense current terminal conductors 70 and 72 would be connected to opposite sides of free layer 66 as shown in FIG. 3 in dashed lines to cause current to flow from one side of free layer 66 to the other, parallel to air-bearing surface 68.

Figure 4:
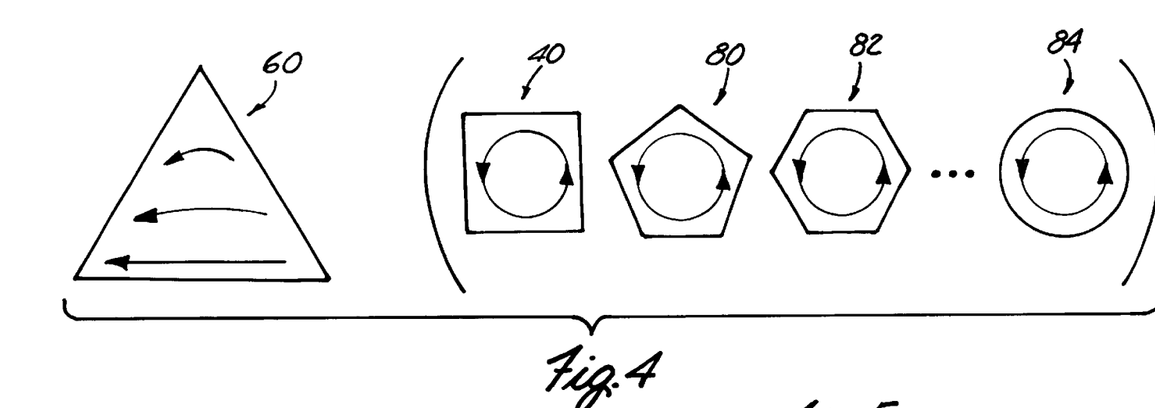
FIG. 4 illustrates magnetic vortex states occurring in several sensor shapes and the suppression of vortex states achieved by the triangular sensor of the present invention.

Triangular MR read element 60 potentially offers a number of advantages over square MR read element 40 (FIG. 2), particularly for sensors having small dimensions. The triangular shape of the sensor suppresses magnetic vortex states more effectively than other symmetrical shapes such as a square. This effect is due to the demagnetizing fields generated near the corners of the triangular sensor element, which tends to resist creation of a vortex state. FIG. 4 illustrates magnetic vortex states occurring in several sensor shapes, including square sensor 40, pentagonal sensor 80, hexagonal sensor 82 and circular sensor 84, and the suppression of vortex states achieved by triangular sensor 60 of the present invention. The arrows in the diagrams of FIG. 4 indicate the direction of magnetization vectors in each sensor, for a magnetic field that tends to cause a magnetic vortex state to occur. Because of the unique shape of the triangular sensor of the present invention, the magnetic vortex state is suppressed, yielding magnetization vectors that are generally oriented as shown by the arrows in triangular sensor 60 in FIG. 4.

Figure 5:
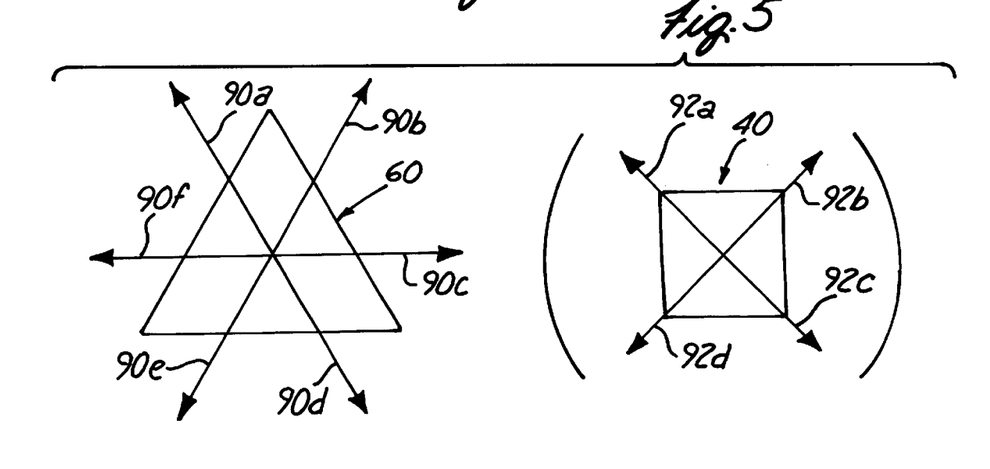
FIG. 5 is a diagram comparing the magnetic easy axes of a triangular sensor to those of a square sensor.

FIG. 5 is a diagram comparing the axes of magnetic symmetry of triangular sensor 60 to those of square sensor 40. Triangular sensor 60 has six-fold rotational magnetic symmetry, while square sensor 40 has only four-fold rotational magnetic symmetry. In other words, there is a 60 degree angle between rays 90*a*, 90*b*, 90*c*, 90*d*, 90*e* and 90*f* of the axes of symmetry of triangular sensor 60, while there is a 90 degree angle between rays 92*a*, 92*b*, 92*c* and 92*d* of the axes of symmetry of square sensor 40. Each order of magnetic symmetry represents an "easy axis" direction of magnetization.

Figure 6:
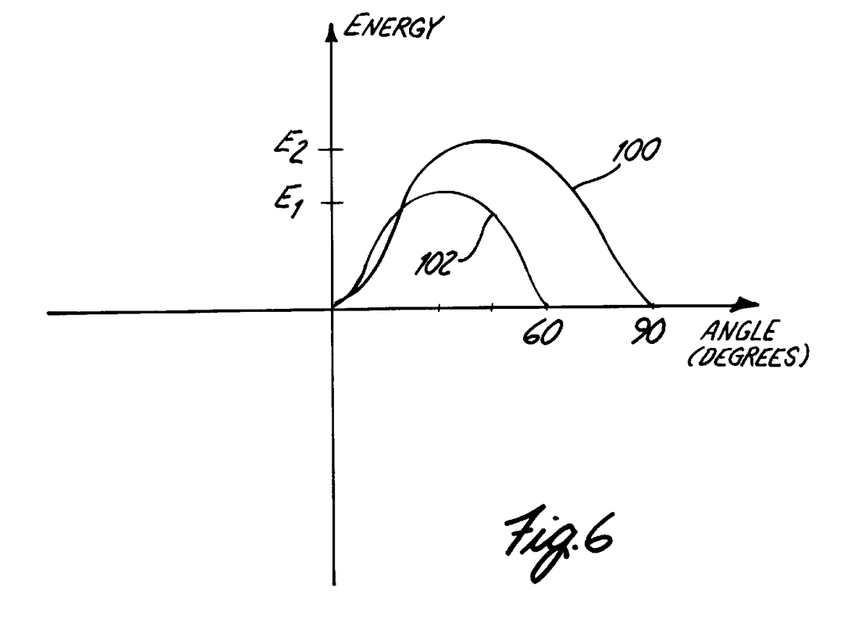
FIG. 6 is a graph illustrating the energy levels associated with rotation of the magnetization vector of an MR sensor between "easy axes" of magnetization.

FIG. 6 is a graph illustrating the energy levels associated with rotation of the magnetization vector of an MR sensor between "easy axes" of magnetization. Curve 100 shows the energy level associated with rotation of the magnetization vector of square MR sensor 40 (shown in FIG. 5 with "easy axes" of magnetization 90 degrees apart), and curve 102 shows the energy level associated with rotation of the magnetization vector of triangular MR sensor 60 (shown in FIG. 5 with "easy axes" of magnetization 60 degrees apart). Curve 100 reaches a higher energy level ($E_1$) in rotating the magnetization of the square MR sensor 90 degrees than the energy level ($E_2$) reached by curve 102 in rotating the magnetization of the triangular MR sensor 60 degrees. Thus, the triangular MR sensor is magnetically "softer" (more sensitive) than the square MR sensor, which is desirable for MR sensors employed in disc drive systems.

Figure 7:
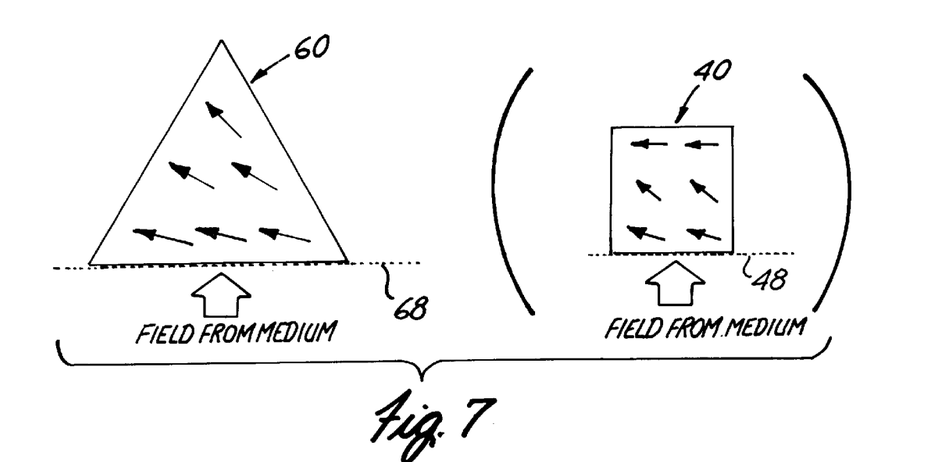
FIG. 7 is a diagram comparing the micromagnetic state of a triangular MR sensor compared to the micromagnetic state of a square sensor.

FIG. 7 is a diagram comparing the magnetization vectors of triangular MR sensor 60 compared to the magnetization vectors of square sensor 40, illustrating the superior magnetic performance of triangular sensor 60 of the present invention. The magnetization vectors of triangular MR sensor 60 and square MR sensor 40 are represented by arrows in FIG. 7. Triangular MR sensor 60 has a shape that places a large portion of its material close to air-bearing surface 68, more so than the material of square MR sensor 40 adjacent to air-bearing surface 48. As a result, more efficient coupling of magnetic flux from the medium into sensor 60 is achieved, and the magnetization vectors of sensor 60 located distant from air-bearing surface 68 are more easily rotated than for square sensor 40. These characteristics improve the efficiency of the sensor in reflecting changes in the magnetic field from the medium as a change in the resistance of the sensor.

Figure 8:
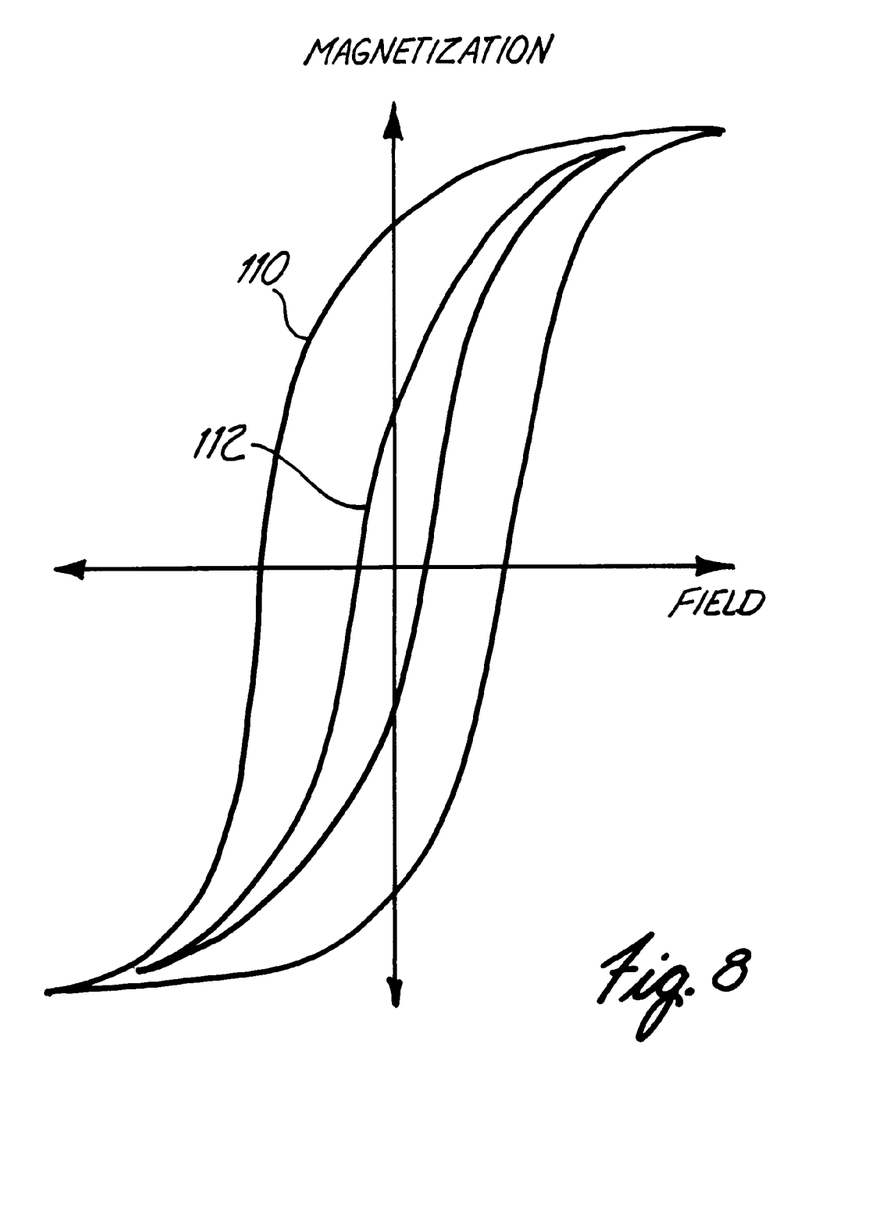
FIG. 8 is a graph illustrating the relationship between the magnetization of square and triangular MR sensors and the field applied to the sensors from a magnetic medium such as a disc.

FIG. 8 is a graph illustrating the relationship between the magnetization of square and triangular MR sensors and the field applied to the sensors from a magnetic medium such as a disc. Curve 110 illustrates this relationship for a square sensor, and curve 112 illustrates this relationship for the triangular sensor of the present invention. As shown by curve 110, the magnetization of the square MR sensor exhibits substantial hysteresis in its response to a magnetic field. In other words, the magnetization does not uniquely identify a particular amount of applied field, depending on the previous state of the magnetization and applied field. This effect essentially amounts to magnetic noise in the response of the sensor. Curve 112 illustrates the significant decrease in the hysteresis effect associated with the triangular MR sensor. More particularly, curve 112 shows that the magnetization of the triangular sensor identifies a much smaller range of applied field values than curve 110, thereby reducing the magnetic noise associated with the sensor response.

Figure 9:
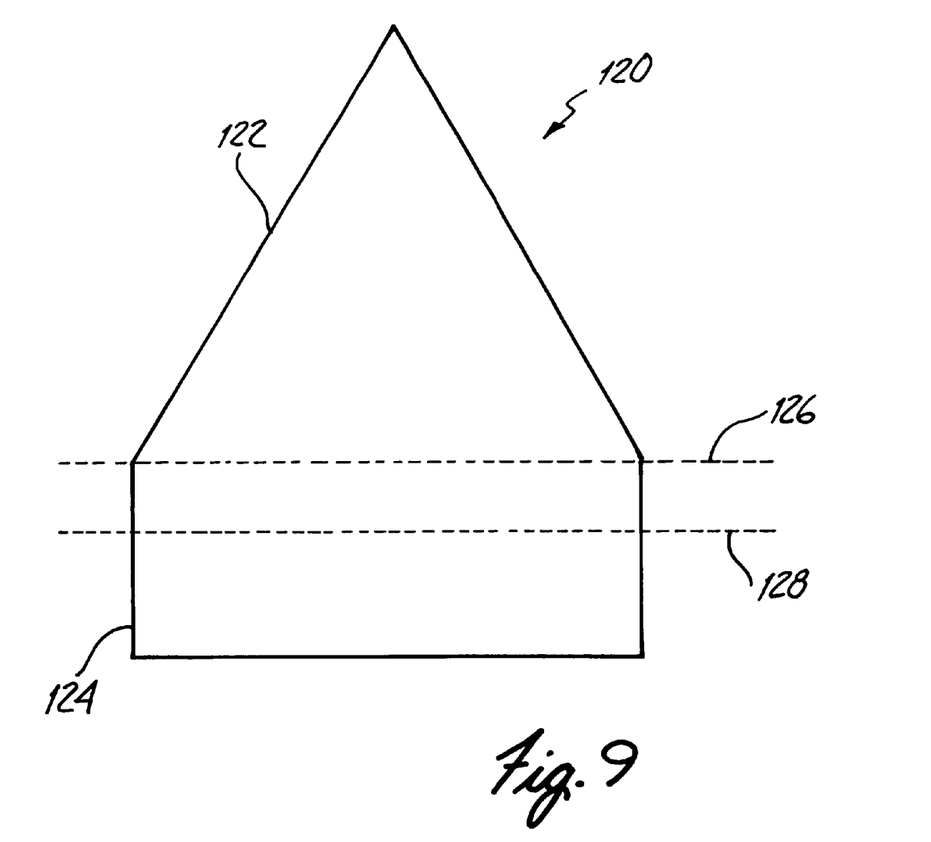
FIG. 9 is a diagram illustrating a modified MR sensor design having a rectangular portion near the air-bearing surface of the sensor to make the sensor more robust to lapping processes.

Due to the shape of the triangular MR sensor, lapping or other similar processes used to form the air-bearing surface do not change the shape or symmetry of the sensor, and therefore the magnetic properties of the sensor are also not significantly affected. However, removing a portion of the sensor (such as by lapping) at the air-bearing surface can change the sensor width at the air-bearing surface, which can potentially be problematic. FIG. 9 shows modified MR sensor 120 that overcomes this difficulty while maintaining an essentially triangular sensor shape. MR sensor 120 has a shape that includes triangular portion 122 and rectangular portion 124. Accurate lapping of MR sensor 120 will yield a triangular sensor having air-bearing surface 126. However, if accurate lapping is not possible, slight underlapping is also accommodated by the shape of MR sensor 120, yielding a generally triangular sensor with a rectangular bottom portion having air-bearing surface 128. The magnetic response of MR sensor 120 having a bottom rectangular portion is still generally advantageous in comparison to a square sensor, and the sensor width of MR sensor 120 is controllable even for imprecise lapping techniques.

While triangular MR read element 60 and modified MR sensor 120 (with a rectangular base and converging side walls extending from the base) have been described as having at least a portion with a triangular shape, it should be understood that the advantageous sensor characteristics described herein may be achieved with shapes that are not exactly triangular. The general principle of the invention is that a sensor shape having a first width at the air-bearing surface and a second width smaller than the first width at a position spaced from the air-bearing surface yields advantageous performance characteristics. This general shape is realized by both of the exemplary embodiments disclosed herein (triangular MR read element 60 and modified MR sensor 120), which both have a base at the air-bearing surface with a first width and two converging sides extending from the base away from the air-bearing surface, such that the sensors have a second width smaller than the first width at a position spaced from the air-bearing surface.

The foregoing discussion illustrates the improved magnetic response characteristics of the triangular MR sensor of the present invention compared to a conventional square MR sensor. In order to construct the triangular MR sensor of the present invention, at least the free layer of the sensor is triangular in shape, and the pinned layer and spacer layer may also be triangular in shape. The triangular MR sensor may be used either in CPP or CIP configurations, and in an alternate embodiment may include a rectangular portion near the air-bearing surface to maintain a consistent sensor width even for imprecise lapping processes performed on the air-bearing surface of the sensor.

Although the present invention has been described with reference to preferred embodiments, workers skilled in the art will recognize that changes may be made in form and detail without departing from the spirit and scope of the invention.

What is claimed is:

1. A magnetic field sensor having an air-bearing surface and comprising:
   a pinned layer;
   a free layer having a width at the air-bearing surface, a first side, and a second side opposite the first side, wherein the first and second sides extend away from the air-bearing surface to form acute angles with the width of the free layer at the air-bearing surface; and
   a spacer layer between the pinned layer and the free layer.

2. The magnetic field sensor of claim 1, wherein the free layer is generally triangular in shape.

3. The magnetic field sensor of claim 2, wherein the pinned layer and the spacer layer are generally triangular in shape.

4. The magnetic field sensor of claim 1, further comprising sense current conductors connected to the sensor in a current perpendicular to plane (CPP) configuration.

5. The magnetic field sensor of claim 1, further comprising sense current conductors connected to the sensor in a current in plane (CIP) configuration.

6. A magnetic field sensor having an air-bearing surface and comprising:
   a pinned layer;
   a free layer having a base at the air-bearing surface and having first and second converging sides forming acute angles with the base and extending to meet at a point away from the air-bearing surface; and
   spacer layer between the pinned layer and the free layer.

7. The magnetic field sensor of claim 6, further comprising sense current conductors connected to the sensor in a current perpendicular to plane (CPP) configuration.

8. The magnetic field sensor of claim 6, further comprising sense current conductors connected to the sensor in a current in plane (CIP) configuration.

9. The magnetic field sensor of claim 6, wherein the base is a rectangular portion having a height extending away from the air-bearing surface.

10. A magnetic field sensor comprising:
    a pinned layer;
    a free layer having a shape with axes of magnetic symmetry that are 60 degrees apart from one another; and
    a spacer layer between the pinned layer and the free layer.

11. The magnetic field sensor of claim 10, wherein the spacer layer and the pinned layer have the same shape as the free layer.

12. The magnetic field sensor of claim 10, further comprising sense current conductors connected to the sensor in a current perpendicular to plane (CPP) configuration.

13. The magnetic field sensor of claim 10, further comprising sense current conductors connected to the sensor in a current in plane (CIP) configuration.

* * * * *